(12) United States Patent
Tingay et al.

(10) Patent No.: US 6,885,009 B2
(45) Date of Patent: Apr. 26, 2005

(54) DEVICE FOR INFLUENCING AN ELECTRON BEAM

(75) Inventors: John Tingay, Cambridge (GB); Brian Raferty, Suffolk (GB); Nigel Crosland, Cambridgeshire (GB)

(73) Assignee: Leica Microsystems Lithography, Ltd., Cambridge (GB)

( * ) Notice: Subject to any disclaimer, the term of this patent is extended or adjusted under 35 U.S.C. 154(b) by 0 days.

(21) Appl. No.: 10/405,500

(22) Filed: Apr. 3, 2003

(65) Prior Publication Data

US 2003/0230727 A1 Dec. 18, 2003

(30) Foreign Application Priority Data

May 31, 2002 (GB) .............................................. 0212784

(51) Int. Cl.⁷ .................................................. G01K 1/08
(52) U.S. Cl. .......................... 250/396 ML; 250/396 R; 250/310; 250/311
(58) Field of Search ...................... 250/396 ML, 396 R, 250/310, 311

(56) References Cited

U.S. PATENT DOCUMENTS

| | | | | |
|---|---|---|---|---|
| 5,008,549 A | * | 4/1991 | Crewe ................. | 250/396 ML |
| 5,136,166 A | * | 8/1992 | Young ................. | 250/396 ML |
| 5,338,939 A | | 8/1994 | Nishino et al. | |
| 5,444,256 A | * | 8/1995 | Nagai et al. ............ | 250/396 R |
| 6,053,241 A | * | 4/2000 | Kendall ................. | 165/104.33 |
| 6,657,204 B2 | * | 12/2003 | Buis et al. .................. | 250/398 |

FOREIGN PATENT DOCUMENTS

| JP | 2210738 | 8/1990 |
|---|---|---|
| JP | 5335219 | 12/1993 |
| JP | 2000048750 | 2/2000 |

* cited by examiner

Primary Examiner—John R. Lee
Assistant Examiner—Kalimah Fernandez
(74) Attorney, Agent, or Firm—Foley & Lardner LLP

(57) ABSTRACT

A device for influencing an electron beam, especially a deflector unit for an electron beam lithography machine, comprises a plurality of coil formers (12b) each with a bore (16) defining a passage for the beam and each carrying coils (18, 19) operable to generate magnetic fields for deflecting the path of the beam when passing through the passage. Each former is made of a high-strength ceramic material having a high thermal conductivity and low coefficient of thermal expansion so that, with respect to a given output of heat by the associated coils during quasi-continuous operation for repeated beam deflection during pattern writing, the heat is dissipated at such a rate as to preclude thermal expansion of the coils and thus avoid distortion of the magnetic fields generated by the coils.

11 Claims, 2 Drawing Sheets

DEVICE FOR INFLUENCING AN ELECTRON BEAM

CROSS REFERENCE TO RELATED APPLICATIONS

This application claims priority of the British patent application 0 212 784.3 which is incorporated by reference herein.

FIELD OF THE INVENTION

The present invention relates to a device for influencing an electron beam and has particular reference to the construction of a coil former in such a device.

BACKGROUND OF THE INVENTION

Electrical coils for generating magnetic fields are widely used for, inter alia, influencing the path of an electron beam in an electron beam lithography machine, an electron microscope or other equipment generating and deploying electron beams for various purposes. Thus, for example, deflector coils are used in lithography machines to provided controlled deflection of a beam with the object of writing a pattern, such as an integrated circuit format, on a substrate. The quasi-continuous operation of such a coil results in ohmic heating of the coil wire and consequently an appreciable output of heat. Known coils are conventionally carried by formers of plastics material, which is a relatively poor conductor of heat and leads to considerable retention of heat by the wire. The resulting increase in wire temperature causes expansion of the coil, especially if multiply wound, and other stresses in the former and thus distortion of the magnetic field. The distortion detracts from accuracy of beam spot placement on the substrate and the reduced accuracy in turn causes increased tolerances in the pattern written by the beam. The finer the pattern features, the greater the effect on writing accuracy by beam positional error attributable to the thermal loading of the coil, in particular the former supporting the coil.

SUMMARY OF THE INVENTION

The object of the invention is therefore the provision of an electron beam influencing device with a coil former which is less susceptible to the effects of coil wire heating and consequently less likely to be the source of a beam positioning error. Other objects and advantages of the invention will be apparent from the following description.

According to the present invention there is provided a device for influencing an electron beam, comprising a coil former defining a passage for the beam and carrying a coil operable to generate a magnetic field for influencing the beam when passing through the passage, the former being produced at least in the region of the coil from a high-strength, non-magnetic and electrically non-conductive ceramic material having a thermal conductivity and coefficient of thermal expansion so selected in relation to a given output of heat by the coil in quasi-continuous operation thereof as to dissipate the heat at a rate substantially precluding thermal expansion of the coil to an extent causing distortion of the generated field.

Such a device employs a coil former material effective to overcome the problems of coil and coil former expansion at the expense—due to the hardness of the appropriate ceramic material—of comparative ease of production. The benefits of the thermal characteristics, however, significantly outweigh any additional expenditures on time and tool costs in coil former manufacture. In the past, lack of recognition of the deleterious effect of coil heat retention in causing expansion during the prolonged use that occurs in, for example, pattern writing machines had the result of preference being given to materials, such as hard plastics, which were uncomplicated to mould and machine and which had adequate electrically insulating, non-magnetic, heat-resisting and thermal expansion properties, but relatively poor capabilities of heat conductance for the purpose of dissipation of heat to the environment. Investigations with other materials have continued to favour or over-emphasise machining properties, so that the desired high thermal conductivity and low coefficient of thermal expansion have not previously been achieved.

For preference, the thermal conductivity is greater than approximately 50 W/m° C. and the coefficient of thermal expansion less than approximately $6.0 \times 10^{-6}/°$ C. These values ensure that the heat normally produced by a coil operated almost continuously to provide electron beam deflection during a pattern-writing procedure will be conducted away from the coil, so that expansion of the coil does not occur and at the same time the conducted heat has no or a negligible influence on the former itself.

The ceramic material is preferably a machinable aluminum nitride ceramic, such as SHAPAL-M (registered trade mark), and can conveniently be used for manufacture of the entire former. It may be sufficient, however, to produce only a part of the former from the ceramic material, particularly in the case of a small size of coil in relation to the overall mass of the former.

In one preferred embodiment of the device the former carries a pair of such coils arranged diametrically opposite one another on either side of the passage and operable to have a reciprocal effect on the respectively generated magnetic fields. This arrangement is sufficient for deflection of an electron beam in a single plane, but if deflection in a further plane or further planes is required the former can then carry a further such pair of coils arranged at right angles to the first-mentioned pair of coils. The two pairs of coils can be appropriately controlled by selective change in the supplied current values to vary the generated magnetic fields in such a manner that the beam can be deflected in any desired direction.

The or each coil, as the case may be, can be located in a slot receptacle in the former and the or each such slot receptacle can be provided by intersecting incisions in the former. The incisions can be produced by cutting the ceramic material, which, notwithstanding tool wear, is simple to achieve with suitably hard (carbide) or hardened precision saws.

In a developed construction, the device comprises a plurality of such formers arranged so that the coil or coils of the respective formers are disposed in succession in the axial direction of the passage. In that case it becomes possible to, for example, initially deflect the electron beam in one direction and then redeflect it in the opposite direction so that it can be constrained to pass at a desired angle through the centre of a focusing lens. In addition, the formers can comprise an outer former and an inner former located in the outer former, the coil or coils carried by the inner former being operable to generate a magnetic field or magnetic fields having an influence on the beam different from that of a magnetic field or magnetic fields generated by the coil or coils of the outer former. This different influence can be, for example, different rates of beam deflection movement for coarse and fine positioning of the beam.

BRIEF DESCRIPTION OF THE DRAWINGS

An embodiment of the present invention will now be more particularly described by way of example with reference to the accompanying drawings, in which.

DETAILED DESCRIPTION OF THE INVENTION

Figure 1:
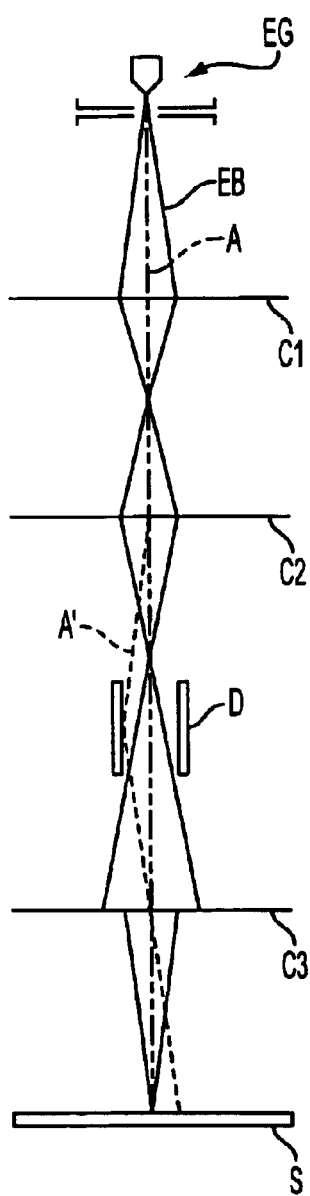
FIG. 1 is a schematic diagram of an electron beam column incorporating a deflector unit embodying the invention.

Referring now to the drawings, FIG. 1 depicts in purely schematic manner the disposition, within an electron beam column of a pattern-writing machine, of a deflector unit for deflecting an electron beam to enable scanning of a substrate surface for the purpose of writing an integrated circuit layout or other desired pattern. This use of the deflector unit is merely by way of example and such units can be employed for deflecting electron beams for other purposes.

In the illustrated example, the column, which has a vertical orientation, comprises an electron gun EG generating an electron beam EB of desired electron voltage for propagation along the column vertical centre axis A and focusing by way of a conventional series of three lenses C1, C2 and C3 and intervening spray apertures (not shown) to form a spot on a suitably prepared writing surface of a movably mounted substrate S. A deflection unit D is located between the second and third (final) lenses of the series and serves to deflect the beam in a directionally controlled manner at, for example, two different rates to cause the focused beam spot to trace the intended pattern on the substrate surface in a field-by-field progression, in which connection the pattern is fractured into main fields and each of these is in turn into subfields. A slower rate of deflection, such as 100 kHz, is provided for beam spot displacement between subfields of a main field to achieve coarse positioning of the spot to, for example, a nearest 20 microns and a faster rate of deflection, such as 25 MHz, is provided for fine spot displacement within each subfield to write pattern features within a range of, in this instance, 20 microns. The beam deflection is generally undertaken in a sequential process, as indicated by the dashed-line beam axis A', of bending the beam away from the column axis A through a predetermined first angle and then bending the beam back towards the axis through a predetermined second angle greater than the first angle by a factor dependent on the positional relationship of the deflector unit D to, in particular, the third lens C3. The deflection process has a twisting effect such as to impart to the beam an approximately helical course. The maximum displacement of the beam spot achievable by the beam deflection is typically 0.8 mm, with displacement beyond that range being produced by movement of the substrate itself relative to the column axis.

Figure 2:
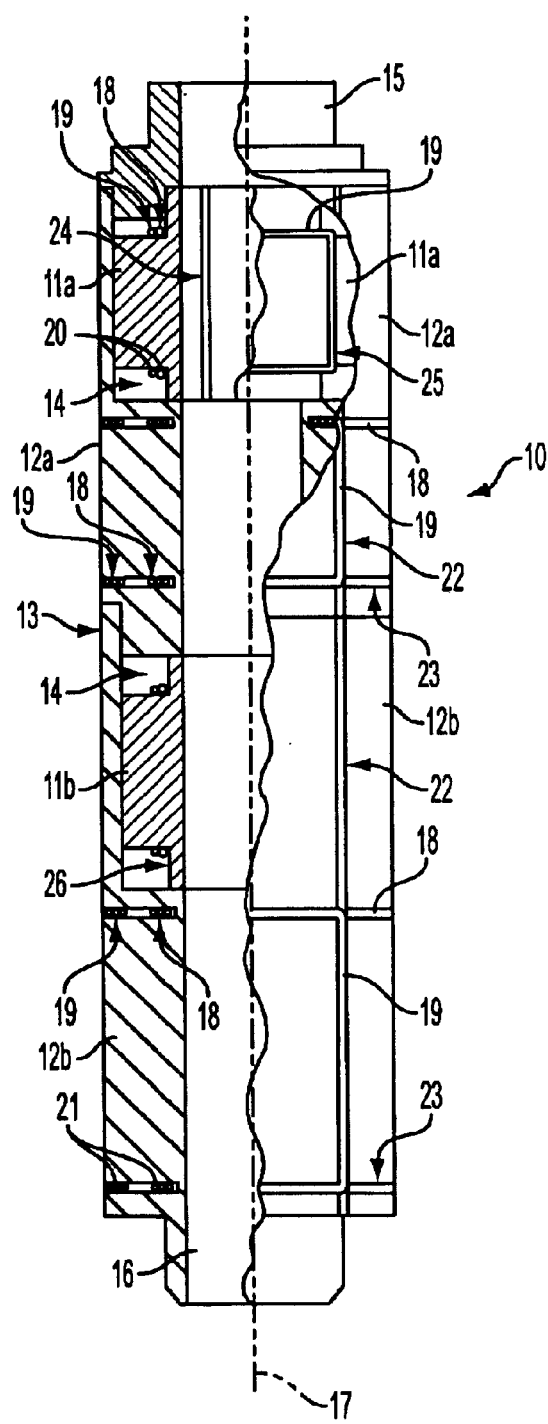
FIG. 2 is a schematic, partly-sectioned elevation view of the deflector unit.

The deflector unit shown in FIG. 2 for providing the requisite dual rate beam deflection is constructed to function on the principle of variable intensity magnetic fields constraining the beam path away from and then back towards the column axis, the magnetic fields being generated by axially spaced sets of coils distributed around the axis in a specific configuration of diametrical opposition. Opposed coils in each set are then controlled in opposite sense so that as field intensity is increased on one side it is decreased on the other to provide a desired beam deflection as described further below. The coils are carried by a coil former assembly 10 consisting, in the illustrated embodiment, of two coaxial hollow cylindrical inner formers 11a, 11b and two coaxial hollow cylindrical outer formers 12a, 12b. The outer formers are sleeved together at a complementary recess and sleeve projection 13 and internally stepped to provide recesses 14 receiving the inner formers, so that the latter are enclosed by the outer formers. The inner formers 11a, 11b are located in the recesses 14 in a fixed angular relationship to each other and to the outer formers 12a, 12b by keying. The assembly 10 is terminated at an upper, i.e. beam entry, end by a locating ring 15 serving to locate the assembly in a mount in the column in a fixed angular relationship thereto by keying. The formers and locating ring are glued together by, for example, cyanoacrylate or other suitable heat-resisting adhesive.

The resulting assembly, which after fitting of the coils can be encapsulated in an electrically insulating bonding material, has a cylindrical shape with a continuous through-bore 16 of constant diameter made up of mating bores of the formers and defining a passage for the electron beam. In the mounted state of the deflector unit, the axis 17 of the throughbore 16 is coincident with the column vertical axis.

Each of the coil formers houses two diametrically opposite, radially inner coils 18 each wound in generally square or oblong shape and two similarly arranged and shaped, radially outer coils 19 arranged at 90° to the inner coils. Each coil is disposed to lie in a cylinder wall segment of the respective former in such an orientation that two opposite sides of the rectangle defined by the coil winding extend parallel to the cylinder axis of the former and the other two sides extend in the circumferential direction of the former. Each coil extends around approximately 120° of the former circumference with the result that in the circumferential direction the two outer coils 19 overlap the two inner coils 18, the overlapping coil regions, however, being electrically separated. In addition, the coil sets 18, 19 of the inner formers 11a, 11b are positioned to be slightly closer to the axis of the respective former than in the case of the coil sets 18, 19 of the outer formers 12a, 12b, the closer the proximity of the coils to the beam the greater the achievable deflection sensitivity.

Figure 3:
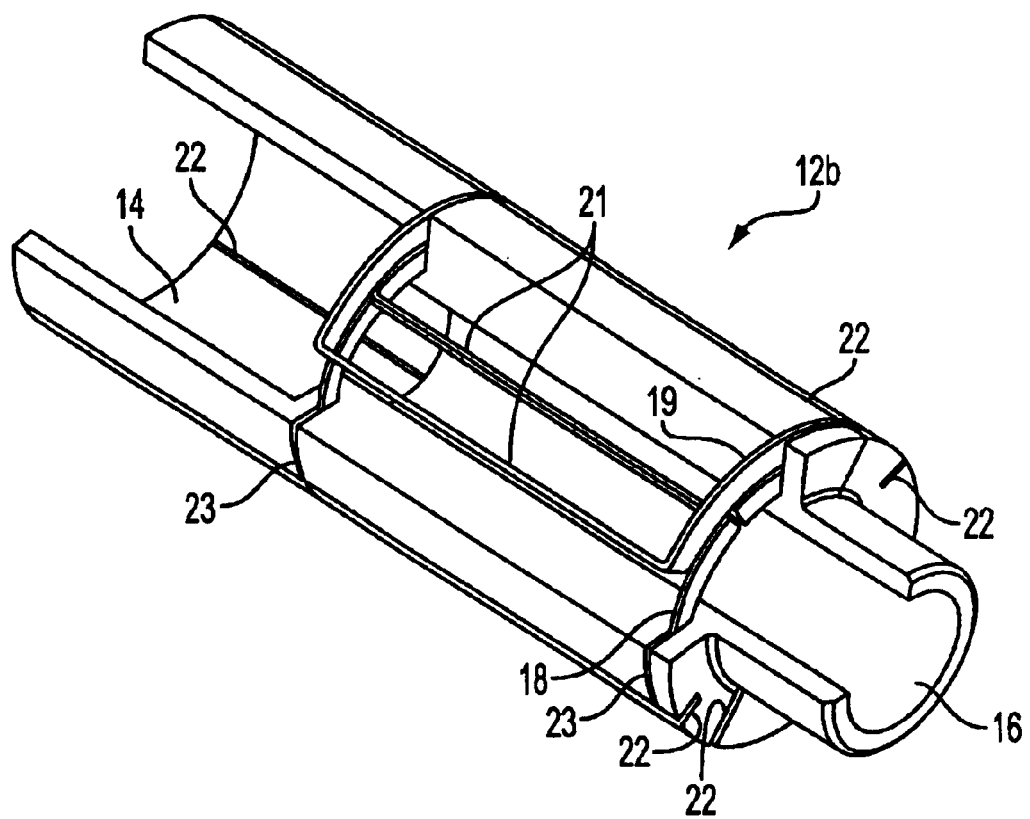
FIG. 3 is a schematic, partly broken-away perspective view of a coil former and associated coils in the unit.

The shape and overlapping arrangement of the coils in one of the coil formers, in particular the lower outer former 12b, is apparent from FIG. 3.

The relative arrangement of the four coil formers and the four sets of coils they carry is such that, with respect to the vertical orientation of the deflector unit when mounted in the column, the coil set 18, 19 of a first or upper one 11a of the inner formers is followed, in the direction of beam propagation, by that of a first or upper one 12a of the outer formers and this in turn is followed by the coil set 18, 19 of a second or lower one 11b of the inner formers and finally by that of a second or lower one 12b of the outer formers. The thus axially spaced coil sets 18, 19 of the inner formers 11a, 11b are assigned to deflection of the beam for fine or subfield scanning and the axially spaced coil sets 18, 19 of the outer formers 12a, 12b are assigned to deflection of the beam for coarse or main-field scanning. For ease of reference, the four formers are termed upper and lower subfield coil formers 11a, 11b and upper and lower main-field coil formers 12a, 12b in the following description.

Beam deflection is achieved by reciprocal change in energisation of the coils of one pair of opposite coils 18 or 19 in a former and/or of the coils of the other pair of opposite coils 18 or 19 in the same former, whereby the beam is deflected by magnetic field effect relative to the column axis through a given angle depending on the degree of reciprocal change and in a given direction within a 360° range depending on the relative action on the individual coils; action solely on the coils of one pair 18 or 19 produces deflection in a direction of—by way of arbitrary designation–0° or 180° and action solely on the coils of the other pair 18 or 19 produces deflection in a direction of 90° or 270°, whilst selective action on the coils of both pairs 18 and 19 produces deflection in any desired intervening angle in the 360° range. For initial coarse scanning, the coil set of the upper main-field former 12a is appropriately influenced to firstly push the beam away from the column axis through a first angle, after which the coil set of the lower main-field former 12b is influenced in reverse sense to pull the beam back through a second angle greater than the first angle so that the beam passes through the focal centre of the final lens C3 at such an inclination relative to the column axis that it can impinge on the substrate surface with a desired offset (amount and direction) from the point of intersection of the axis with the surface. The thus coarsely positioned beam spot can then be finely positioned during actual pattern writing, by analogous sequential influencing of the coil sets of the upper and lower subfield formers 11a, 11b. The beam deflection for fine scanning by the spot is undertaken at a preset clock rate selected to provide an intended electron dose at each dwell point of the spot for the purpose of writing by, for example, electron-induced erosion or other change in an electron-sensitive layer on the substrate surface.

It is to be emphasised that the described numbers, arrangement and functional interaction of the coils of the coil formers are merely by way of example. A considerable degree of freedom exists for tailoring the number, size, shape and disposition of the coils to the requirements of an individual column and a particular scanning task.

Each coil is composed of a winding 20 or windings 21 of thin copper wire with an electrically insulating coating, the coils of the subfield coil formers 11a, 11b for higher-speed beam deflection over small distances each consisting of a single winding 20 and those of the main-field coil formers 12a, 12b for lower-speed deflection over greater distances each consisting of multiple windings 21. Due to their low inductance, the single windings 20 accept a faster rate of change in supplied current and consequently offer a faster rate of beam deflection for the small increments of beam spot movement within the 20 micron range. The coils are formed in each main-field (outer) former 12a or 12b by insertion of the respective winding wires into corresponding square or oblong slot receptacles produced in the formers by intersecting, externally open longitudinally oriented incisions 22 and circumferentially oriented incisions 23, the longitudinal incisions 22 for the radially inner coils 18 being deeper than those for the radially outer coils 19. In the case of the subfield (inner) formers 11a, 11b the coils are formed by insertion of the wires into externally open longitudinal incisions 24 and internally open longitudinal incisions 25 at the respective former and by laying the wires in circumferential direction on steps 26 at the ends of the former. The paths of the incisions 22, 23 and windings 21 disposed therein to define the coils 18, 19 are shown more clearly in FIG. 3.

The provision of four coils in each set, overlapping of the coils and recessing in slot receptacles create unfavourable conditions of heat transmission to the surrounding former material under quasi-continuous operation of the coils, with limited scope for effectively cooling the coils and coil formers by forced air currents or other such measures. Heat retention in the formers in such circumstances leads to expansion of and other stresses in both the coils and the formers, which in turn produce distortions in the magnetic fields generated by the coils and consequent undesired influences on the beam path when deflected. These influences cause errors in the writing of patterns, for which a high level of accuracy is usually essential. To eliminate or at least significantly mitigate these thermal influences, each former is made from a high-strength, non-magnetic and electrically non-conductive ceramic material which is selected so that the parameters of high thermal conductivity and low coefficient of expansion have primacy over the otherwise important factor of compatibility with machining requirements, but which still allows production of sufficiently robust components. A particularly suitable ceramic material is the translucent machinable aluminum nitride ceramic marketed as SHAPAL-M (registered trade mark), which has a high thermal conductivity in the preferred range of above 50 W/m° C., in particular 90 to 100 W/m° C., but retains a sufficiently low coefficient of expansion of 4.4 to $5.2 \times 10^{-6}$/° C. The coefficient of expansion is generally similar to that of the conventionally used polyetheretherketone plastics material, but the thermal conductivity is markedly higher so as to provide enhanced dissipation of heat from the coils and substantially reduced tendency of the coils to expand under constant resistive heating during use. Other ceramics, for example certain boron nitrides, may have satisfactory or even better thermal characteristics, but insufficient mechanical strength to satisfactorily withstand the stresses arising in manufacture and servicing of coil formers made from this material. Due to its hardness (560 on the Vickers scale), the above-mentioned aluminum nitride ceramic imposes some machining constraints in production by comparison with more readily processible ceramics. The starting ceramic product in bar form is firstly heated in a furnace to allow machining, then turned and milled to define external and internal profile shapes and thereafter cut by a precision saw to form the incisions 22 to 25 for the slot receptacles. The hardness results in comparatively rapid consumption of machining tool bits and blades, which consequently require more frequent replacement; this penalty is acceptable in terms of the piece numbers usually involved and in view of the substantial operational advantages gained from the stated thermal properties. Other, more easily machinable ceramics do not offer the desired high level of thermal conductivity with retention of a low coefficient of thermal expansion.

A coil former produced from the specified ceramic material can thus be used individually or incorporated in a coil former assembly to provide a deflector unit with significantly reduced susceptibility to thermally-induced magnetic field distortions and pattern writing error attributable to such distortions. The benefits are particularly noticeable in the case of coil former assemblies with multiply wound coil sets recessed in the formers, the high rate of heat conductance from the coils to the former material and from that material to the sub-atmospheric environment of the column then being such as to counteract the otherwise strong heat sink effect of the formers.

What is claimed is:

1. A device for influencing an electron beam, comprising a coil former defining a passage for the beam and carrying a coil operable to generate a magnetic field for influencing the beam when passing through the passage, the former being produced at least in the region of the coil from a high-strength, non-magnetic and electrically non-conductive ceramic material having a thermal conductivity and coefficient of thermal expansion so selected in relation to a given output of heat by the coil in quasi-continuous operation thereof as to dissipate the heat at a rate substantially precluding thermal expansion of the coil to an extent causing distortion of the generated field, wherein the ceramic material is configured to substantially dissipate the heat without use of a forced cooling fluid.

2. The device according to claim 1, wherein the thermal conductivity is greater than 50 W/m° C. and the coefficient of thermal expansion is less than $6.0 \times 10^{-6}$/° C.

3. The device according to claim 1, wherein the ceramic material is a machinable aluminum nitride ceramic.

4. The device according to claim 1, wherein the entire former is made of the ceramic material.

5. The device according to claim 1, wherein the former carries a pair of such coils arranged diametrically opposite one another on either side of the passage and operable to have a reciprocal effect on the respectively generated fields.

6. The device according to claim 5, wherein the former carries a further such pair of coils arranged at right angles to the first-mentioned pair of coils.

7. The device according to claim 1, wherein the or each coil, as the case may be, is located in a slot receptacle in the former.

8. The device as claimed in claim 7, wherein the or each slot receptacle is provided by intersecting incisions in the former.

9. The device according to claim 1, comprising a plurality of such formers arranged so that the coil or coils of the respective formers are disposed in succession in the axial direction of the passage.

10. The device according to claim 9, wherein the formers comprise an outer former and an inner former located in the outer former, the coil or coils carried by the inner former being operable to generate a magnetic field or magnetic fields having an influence on the beam different from that of a magnetic field or magnetic fields generated by the coil or coils of the outer former.

11. The device according to claim 1, wherein the device is a deflector unit for deflecting the path of the beam.

* * * * *